United States Patent
Kim

(10) Patent No.: US 11,307,255 B2
(45) Date of Patent: Apr. 19, 2022

(54) DEVICE AND METHOD FOR CHECKING WHETHER CONTACTOR PROVIDED IN ESS IS WELDED

(71) Applicant: LG CHEM, LTD., Seoul (KR)

(72) Inventor: Young Hwan Kim, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 0 days.

(21) Appl. No.: 17/057,860

(22) PCT Filed: Nov. 18, 2019

(86) PCT No.: PCT/KR2019/015784
§ 371 (c)(1),
(2) Date: Nov. 23, 2020

(87) PCT Pub. No.: WO2020/105995
PCT Pub. Date: May 28, 2020

(65) Prior Publication Data
US 2021/0199720 A1    Jul. 1, 2021

(30) Foreign Application Priority Data
Nov. 22, 2018    (KR) .................. 10-2018-0145364

(51) Int. Cl.
*G01R 31/327* (2006.01)
*G01R 31/382* (2019.01)
*G01R 31/364* (2019.01)

(52) U.S. Cl.
CPC ....... *G01R 31/3275* (2013.01); *G01R 31/364* (2019.01); *G01R 31/382* (2019.01)

(58) Field of Classification Search
None
See application file for complete search history.

(56) References Cited

U.S. PATENT DOCUMENTS 6,376,932 B1 * 4/2002 Yang ................. H05B 47/105
                                                    307/66
2008/0002322 A1    1/2008 Hirasawa
(Continued)

FOREIGN PATENT DOCUMENTS

JP    4-183221 A    6/1992
JP    4570859 B2    10/2010
(Continued)

OTHER PUBLICATIONS

International Search Report (PCT/ISA/210) issued in PCT/KR2019/015784 dated Mar. 2, 2020.
(Continued)

*Primary Examiner* — Nasima Monsur
(74) *Attorney, Agent, or Firm* — Birch, Stewart, Kolasch & Birch, LLP

(57) ABSTRACT

The present invention relates a device and method for checking the welding of a contactor of an energy storage system (ESS) without blocking the flow of current including a contactor of two relays connected in parallel that is used without blocking the flow of current, a battery system controller (BSC) determining whether to use the ESS, a plurality of battery racks connected with each other and an ESS power cut-off unit for blocking the use of the ESS by receiving a command from the BSC, the contactor has a first end connected to the plurality of battery racks and a second end connected to a positive output terminal of the ESS.

9 Claims, 2 Drawing Sheets

(56) References Cited

U.S. PATENT DOCUMENTS

| | | | |
|---|---|---|---|
| 2013/0090793 A1 | 4/2013 | Hwang et al. | |
| 2013/0093427 A1* | 4/2013 | Bemrich | G01R 31/3278 324/418 |
| 2014/0125259 A1* | 5/2014 | Knight | G01R 31/3842 318/139 |
| 2014/0354054 A1 | 12/2014 | Katou | |
| 2016/0075251 A1 | 3/2016 | Choi | |
| 2018/0238968 A1* | 8/2018 | Wada | F02N 11/10 |

FOREIGN PATENT DOCUMENTS

| | | |
|---|---|---|
| JP | 5751282 B2 | 7/2015 |
| JP | 2018-108023 A | 7/2018 |
| KR | 10-1241168 B1 | 3/2013 |
| KR | 10-2014-0061637 A | 5/2014 |
| KR | 10-2016-0931808 A | 3/2016 |
| KR | 10-1726922 B1 | 4/2017 |
| KR | 10-2017-0093040 A | 8/2017 |
| KR | 10-1821008 B1 | 3/2018 |

OTHER PUBLICATIONS

Extended European Search Report for European Patent Application No. 19886153.6 dated Jul. 26, 2021.

* cited by examiner

DEVICE AND METHOD FOR CHECKING WHETHER CONTACTOR PROVIDED IN ESS IS WELDED

TECHNICAL FIELD

The present invention relates to a device and method for checking a welding of a contactor in an energy storage system (ESS).

More particularly, the present invention relates to a device and method for checking a welding of a contactor without blocking the flow of current.

BACKGROUND ART weldingRecently, due to the depletion of fossil energy and the environmental pollution caused by the use of fossil energy, there is a growing interest in electrical products that can be driven using secondary batteries. Accordingly, as technology developments and demands on a mobile device, an electric vehicle (EV), a hybrid vehicle (HV), an energy storage system (ESS), and an uninterruptible power supplies (UPS), and the like increase, the demand for secondary batteries as an energy source is rapidly increasing.

In addition to the primary benefit of dramatically reducing the use of fossil energy, there is no by-product of the use of energy. Therefore, these secondary batteries are attracting attention as a new energy source for eco-friendliness and energy efficiency.

Meanwhile, the plurality of secondary batteries may be connected to form a module, and the modules may be connected to form one ESS.

In the ESS formed through such a manner, a contactor is used to electrically connect the external device with the ESS.

The contactor is artificially opened if there is a problem with the use of the ESS. Therefore, a battery system controller (BSC) of the ESS should periodically check whether the contactor provided in the ESS is welded.

In the related art of checking whether the contactor is welded, the flow of current in the contactor is blocked, and then a welding state of the contactor is checked.

However, since the ESS maintains a state of being always connected to the power grid, it is difficult to block the flow of current to check whether the contactor is welded.

Therefore, the present invention proposes a device and method for checking the welding of the contactor of the ESS without blocking the flow of current.

(Patent Document) KR10-2013-0051102 A

DISCLOSURE OF THE INVENTION

Technical Problem

The present invention provides a device and method for checking the welding of a contactor of an energy storage system without blocking the flow of current.

Technical Solution

In accordance with an exemplary embodiment, an energy storage system (ESS) that is configured to be always connected to the power grid includes a battery system controller (BSC) configured to determine Whether to use the ESS based on a battery current, voltage, and temperature, a plurality of battery racks connected in series or in parallel with each other, a positive output terminal configured to output a power supplied from the plurality of battery racks to outside, and an ESS power cut-off unit configured to block the use of the ESS by receiving a command of the BSC;

The ESS power cut-off unit may include a contactor having a first end connected to each battery rack of the ESS and a second end connected to the positive output terminal of the ESS, the contactor is configured to form an electrical path between the battery rack and the positive output terminal of the ESS, and a current measuring unit positioned on an electrical path between each battery rack and the contactor, the current measuring unit is configured to measure a current of the path and transmit the measured current to the BSC.

The contactor may include a first relay having a first end connected to an output of the current measuring unit and a second end connected the positive output terminal of the ESS to form a first current path, a second relay having a first end connected to the output of the current measuring unit and a second end connected to the positive output terminal of the ESS to form a second current path, a first detection unit configured to detect whether the first relay is welded and transmit a detection result to the BSC, and a second detection unit configured to detect whether the second relay is welded and transmit a detection result to the BSC, and the first relay and the second relay may be connected in parallel.

The first detection unit may be a current meter having a first end connected to the output terminal of the current measuring unit and a second end connected to the positive output terminal of the ESS to form a parallel circuit with the first relay, the first detection unit is configured to measure a current when the first relay opened, and the second detection unit may be a current meter having a first end connected to the output terminal of the current measuring unit and a second end connected to the positive output terminal of the ESS to form a parallel circuit with the second relay, the second detection unit is configured to measure a current when the second relay is opened.

The first detection unit includes a first photo coupler, the first photo coupler is connected in parallel with the first relay and when the first relay is open, current flows to the first photo coupler to emit light. The first photo coupler includes a first light emitting part and a first light receiving part insulated from the first light emitting part, the first light emitting part is configured to emit light when there is no welding in the first relay and not emit light when there is a welding, and the first light receiving part is configured to transmit an electrical signal to the BSC when an optical signal is inputted from the first light emitting part.

The second detection unit includes a second photo coupler, the second photo coupler is connected in parallel with the second relay and when the second relay is open, current flows to the second photo coupler to emit light.

The second photo coupler includes a second light emitting part and a second light receiving part insulated from the second light emitting part, the second light emitting part is configured to emit light when there is no welding in the second relay and does not emit light when there is a welding in the second relay, the second light receiving part is configured to transmit an electrical signal to the BSC when an optical signal is inputted from the second light emitting part.

In accordance with another exemplary embodiment, a method for detecting whether a contactor of an ESS connected always to a power grid is welded includes a current measuring step of measuring an output current of the current ESS by a current measuring unit, a current checking step of checking whether the measured output current of the ESS is less than an allowable current of a first relay and a second relay constituting the contactor, a first relay welding checking step of opening the first relay and checking whether the first relay is welded using a first detection unit when the output current of the ESS is less than the allowable current of the first relay and the second relay, and a second relay welding checking step of checking whether the second relay is welded using a second detection unit after closing the open first relay and opening the second relay.

The first relay has a first end connected to an output of the current measuring unit and a second end connected to a positive output terminal of the ESS to form a first current path. The second relay has a first end connected to the output of the current measuring unit and a second end connected to the positive output terminal of the ESS to form a second current path. In the first relay welding checking step, when the first relay is opened and the first current path is cut off and the current flows only through the second current path, the first detection unit is used to check whether the first relay is welded. In the second relay welding checking step, the first relay is closed and the second relay is open to cut off the second current path, and whether the second relay is welded is checked using a second detection unit while current flows only in the first current path.

The second relay welding checking step is performed only when welding of the first relay is not detected and when the welding of the first relay is detected in the first relay welding checking step, a first relay welding detection signal is transmitted to a BSC, and the second relay welding checking step is not performed.

Advantageous Effects

The present invention can check whether the contactor of the ESS is welded without blocking the flow of current.

MODE FOR CARRYING OUT THE INVENTION

Figure 1:
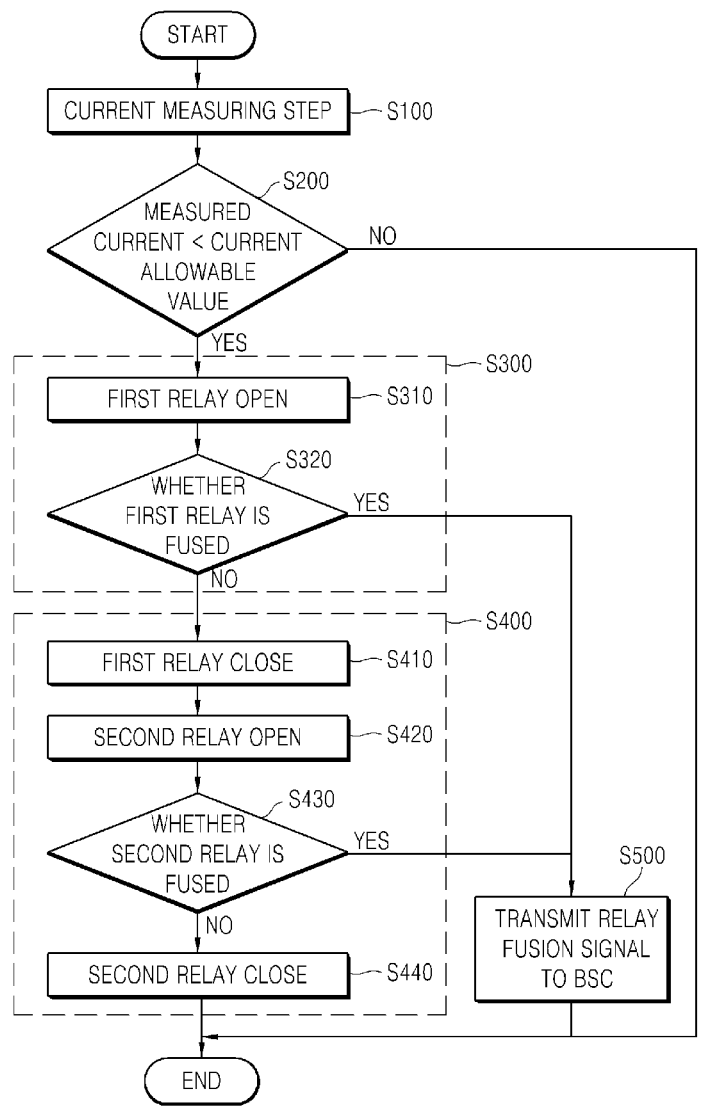
FIG. 1 is a flowchart illustrating a method for checking a welding of an ESS contactor according to embodiment of present invention.

Hereinafter, embodiments of the present invention will be described in detail with reference to the accompanying drawings so that those skilled in the art may easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "initial," "second," etc., may be used herein to describe various elements, these elements should not be limited by these terms. The above terms are used only to distinguish one component from another. For example, an initial component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

1. Method for checking welding of ESS contactor according to embodiment of present invention.

FIG. 1 is a flowchart illustrating a method for checking a welding of an ESS contactor according to embodiment of present invention.

Hereinafter, a method for checking whether the ESS contactor is welded according to an embodiment of the present invention will be described with reference to FIG. 1.

A method for checking whether an ESS contactor is welded may include a current measuring step S100 of measuring an output current of the current ESS by a current measuring unit, a current checking step S200 of checking whether the measured output current of the ESS is less than an allowable current of a first relay and a second relay constituting the contactor, a first relay welding checking step S300 of opening a first relay constituting the contactor and checking whether the first relay is welded using a first detection unit when the output current of the ESS is less than an allowable current of the first relay and the second relay, and a second relay welding checking step S400 of checking whether the second relay is welded using a second detection unit after closing the open first relay and opening the second relay.

On the other hand, in relation to the method of checking the welding of the ESS contactor of the present invention, when detecting the welding among the two relays that constitute the contactor, wince one relay that measures the welding is disconnected and only current flows through the other relay, it should check that the current value is within the allowable current range of one relay.

In other words, both relays are normally closed, so that current flows through both a first current path through which current flows through the first relay and a second current path through which current flows through the second relay.

However, in relation to the method of checking whether the contactor is welded, since the ESS is always connected to the power supply, it is difficult to completely block the flow of current. Therefore, in the welding checking step S300 of the first relay to check whether the first relay is welded, the first relay is opened (S310), and the second relay maintains the closed state so that the current flows only through the second current path and checks whether the first relay is welded (S320).

In such a way, when the current flowing in both the first and second current paths flows in the second current path as it is in the welding checking step S300 of the first relay, since damage to the second relay can occur, it is necessary to check whether the current measured by the current measuring unit is within the allowable range of one second relay in the current checking step S200.

In other words, based on a result of the checking in the current checking step S200, it is possible to check whether the contactor is welded only when the current is in a range that can be handled by one relay.

Meanwhile, in the first relay welding checking step S300, whether the first relay is welded may be checked using the first detection unit (S320). For example, the first detection unit may include a first photo coupler. Specifically, the first photo coupler may have a first light emitting part and a first light receiving part at the same time, and the first light emitting part and the first light receiving part may be electrically insulated from each other, and a signal may be transmitted by an optical signal. In relation to the principle of operation, when the first light emitting part of the first photo coupler emits light and the light is incident on the first light receiving part, it becomes a conduction state. The photo coupler is unidirectional.

Therefore, since the first relay is opened (S310) in the first relay welding checking step S300 of the present invention, it is normal that the light emitting part emits light as the current flows to the first photo coupler.

On the contrary, despite the command to open the first relay, if a welding occurs in the first relay and thus the first relay is not opened and remains closed continuously, since most of the current flows through the first relay path instead of the first photo coupler, no current flows through the first photo coupler so that the first light emitting part does not emit light.

In other words, since the first relay welding checking step S300 opens the first relay (S310), when the first photo coupler emits light, the first relay is in a normal state and the fact that the first photo coupler does not emit light means that welding occurs in the first relay.

On the other hand, the first relay welding checking step S300 described above is just an example of detecting whether the first relay is welded using a photo coupler. The present invention is not limited to this, and various methods for checking whether the relay is welded may be used.

Meanwhile, in the first relay welding checking step S300, if the welding of the first relay is not detected based on a result of checking the welding of the first relay by the first detection unit, the second relay welding checking step S400 may be performed.

However, when the welding of the first relay is detected in the first relay welding check step S300, a first relay welding detection signal is transmitted from the first detection unit to the BSC (S500), and the second relay welding checking step S400 may not be performed.

Specifically, the detection of the welding of the first relay means that it is difficult for the first relay to perform its normal function. That is, in a state in which the first relay is failed, it is not possible to check whether the second relay is welded.

That is, in the present invention, the second relay welding checking step (S400), only the first relay is closed and the second relay is open. Since welding occurs in the first relay, the first relay does not perform a normal function. Therefore, in order to check whether the second relay is welded, it is not preferable to open the second current path and to flow current only through the abnormal first current path.

Therefore, it is desirable not to perform the second relay welding checking step.

Meanwhile, in the second relay welding checking step S400, whether the second relay is welded may be checked using the second detection unit (S430). At this time, the first relay is closed (S410) and the second relay is open (S420) so that current flows only through the first path.

The second detection unit may, for example, include a photo coupler. Specifically, the second photo coupler may have a second light emitting part and a second light receiving part at the same time, and the second light emitting part and the second light receiving part may be electrically insulated from each other, and a signal may be transmitted by an optical signal. In relation to the principle of operation, when a signal is inputted to the light emitting diode in the second photo coupler, the first light emitting part emits light, and the light may be received by the second light receiving part to generate an electrical signal.

Therefore, since the second relay is opened (S420) in the second relay welding checking step (S400) of the present invention, it is normal that the light emitting part emits light as the current flows to the photo coupler.

On the contrary, despite the command to open the second relay, if a welding occurs in the second relay and thus the second relay remains closed continuously, since most of the current flows through the second relay path instead of the photo coupler, no current flows through the photo coupler so that the light emitting part does not emit light.

In other words, since the second relay welding checking step opens the second relay, when the photo coupler emits light, the second relay is in a normal state and the fact that the photo coupler does not emit light means that welding occurs in the second relay.

On the other hand, the second relay welding checking step S400 described above is just an example of detecting whether the second relay is welded using a photo coupler. The present invention is not limited to this, and various methods for checking whether the relay is welded may be used.

On the other hand, if the welding of the second relay is not detected in the second relay welding checking step S400, the open second relay may be closed (S440), and the procedure of checking whether the ESS contactor is welded may be terminated.

Meanwhile, when welding of the second relay is detected in the second relay welding checking step, after transmitting the second relay welding detection signal from the second detection unit to the BSC (S500), the above-described an ESS contact welding checking procedure may be terminated.

2. ESS According Another Embodiment of Present Invention

Figure 2:
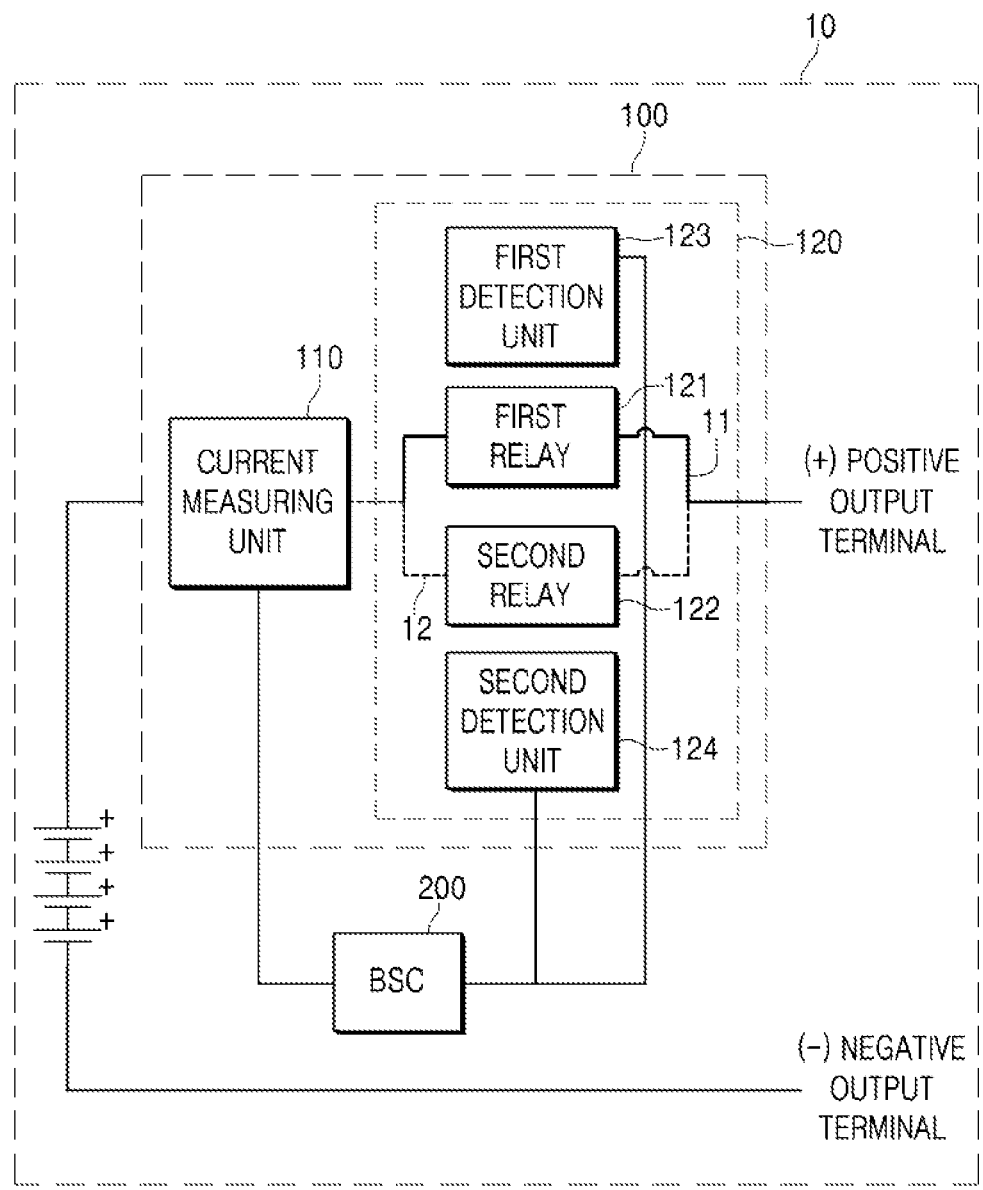
FIG. 2 is a diagram illustrating an ESS according to another embodiment of the present invention.

FIG. 2 is a diagram illustrating an ESS according to another embodiment of the present invention.

Hereinafter, an ESS according to another embodiment of the present invention will be described with reference to FIG. 2.

An ESS 10 according to another embodiment of the present invention is always connected to the power grid.

Therefore, it is impossible to completely block the current flowing through the ESS 10.

On the other hand, the ESS 10 may include a BSC 200 for determining whether to use the ESS based on the battery current, voltage, and temperature, a plurality of battery racks mutually connected in series or in parallel with each other, a positive output terminal for outputting power supplied from the plurality of battery racks to the outside, and an ESS power cut-off unit 100 for blocking the use of the ESS in response to a command of the BSC.

The ESS power cut-off unit 100 may include a contactor whose one end is connected to the battery rack of the ESS and other end is connected to the positive output terminal of the ESS 10 and that forms an electrical path between the battery rack and a positive output terminal of the ESS and a current measuring unit 110 disposed on an electrical path between the battery rack and the contactor to measure a current of the path and transmit the current to the BSC 200.

On the other hand, when the ESS of the present invention checks the welding of the two relays constituting the contactor, one relay to check for welding is disconnected, and the current only flows through the other relay, so that it is necessary to check that the current value is within the allowable current range of one relay.

In other words, both relays are normally closed, so that current flows through both a first current path through which current flows through the first relay and a second current path through which current flows through the second relay.

However, when checking whether the contactor is welded, for example, when checking whether the first relay is welded, the first relay is open (S310), and the second relay is kept closed so that the current flows only through the second current path to check whether the first relay is welded.

That is, since the current flows only through the second relay when checking the welding of the first relay, the output current of the ESS should be within the range allowed by the second relay.

Meanwhile, the BSC 200 may periodically check whether the contactor 120 is welded.

Specifically, the contactor 120 may include a first relay 121 having one end connected to an output terminal of the current measuring unit 110 and the other end connected to a positive output terminal of the ESS to form a first current path 11, a second relay 122 having one end connected to an output terminal of the current measuring unit 110 and the other end connected to a positive output terminal of the ESS to form a second current path 12, a first detection unit 123 that detects whether the first relay 121 is welded and transmits a detection result to the BSC 200, and a second detection unit 124 that detects whether the second relay 122 is welded and transmits a detection result to the BSC 200.

Meanwhile, in FIG. 2, the reason that the connection relationship between the input and output terminals of the first and second detection units is not clearly implemented is because the connection relationship with the first and second relays is determined according to the components used as the first and second detection units.

For example, when the first and second detection units are configured as photo couples, the first and second detection units may be connected in parallel with the first and second relays, respectively.

Meanwhile, when the first detection unit 123 detects whether the first relay 121 is welded, the first current path 11 is blocked, and current can flow only in the second current path 12. When the second detection unit 124 detects whether the second relay 122 is welded, the second current path 12 is blocked, and current can flow only in the first current path 11.

By connecting the first and second relays in parallel as described above, it is possible to check the welding of the first and second relays sequentially without interrupting the flow of current.

In other words, the first detection unit has one end connected to the output terminal of the current measuring unit and the other end connected to the positive output terminal of the ESS. The first detection unit may configure a parallel circuit with the first relay and if the first relay is open, the first detection unit may be a current meter that measures current on a parallel path.

For example, the first detection unit 123 may include a first photo coupler. Specifically, the first photo coupler may have a first light emitting part and a first light receiving part at the same time, and the first light emitting part and the first light receiving part may be electrically insulated from each other, and a signal may be transmitted by an optical signal. In relation to the principle of operation, when a current flows through the first photo coupler, the first light emitting part may emit light and generate an electrical signal when the light is received by the first light receiving part. In other words, when the first relay is open, the first photo coupler is connected in parallel with the first relay so that current flows to the first photo coupler to emit light.

Therefore, since the first detection unit 123 of the present invention detects the welding of the first relay while the first relay 121 is opened, so that as the current flows to the first photo coupler, the first light emitting part emits light.

Meanwhile, the first light receiving part of the first detection unit 123 may receive an optical signal from the first light emitting part, convert the received optical signal into an electrical signal, and transmit the electrical signal to the BSC 200. On the other hand, when welding occurs in the first relay 121, it is preferable not to detect whether the second relay 122 is welded.

Specifically, the detection of the welding of the first relay 121 means that it is difficult for the first relay 121 to perform its normal function. That is, in the present invention, when checking whether the second relay is welded, only the first relay is closed and the second relay is open. Since welding occurs in the first relay, the first relay does not perform a normal function. Therefore, in order to check whether the second relay is welded, it is not preferable to open the second current path 12 and to flow current only through the abnormal first current path 11.

Therefore, it is preferable not to detect whether the second relay 122 is welded.

Meanwhile, when welding does not occur in the first relay 121, whether the second relay 122 is welded may be checked.

Specifically, when checking whether the first relay 121 is welded, the first relay 121 may be closed to form the first current path 11, and the second relay 122 may be opened to cut off the second current path 12.

Meanwhile, the details of checking whether the second relay 122 is welded in the second detection unit 124 may be the same as the procedure of detecting whether the first relay 121 is welded in the first detection unit 123 described above.

In detail, the second detection unit has one end connected to the output terminal of the current measuring unit and the other end connected to the positive output terminal of the ESS. The second detection unit may configure a parallel circuit with the first relay and if the second relay is open, the second detection unit may be a current meter that measures current on a parallel path.

For example, the second detection unit 123 may include a second photo coupler. Specifically, the second photo coupler may have a second light emitting part and a second light receiving part at the same time, and the second light emitting part and the second light receiving part may be electrically insulated from each other, and a signal may be transmitted by an optical signal. In relation to the principle of operation, when a current flows through the second photo coupler, the second light emitting part may emit light and generate an electrical signal when the light is received by the second light receiving part. In other words, when the second relay is open, the second photo coupler is connected in parallel with the second relay so that current flows to the second photo coupler to emit light.

Therefore, since the second detection unit 123 of the present invention detects the welding of the second relay while the second relay 122 is opened, so that as the current flows to the second photo coupler, the second light emitting part emits light.

Meanwhile, the second light receiving part of the second detection unit 124 may receive an optical signal from the second light emitting part, convert the received optical signal into an electrical signal, and transmit the electrical signal to the BSC 200.

On the other hand, when it is checked that there is no welding of the second relay 122 in the second detection unit 124, the second relay may be closed to allow current to flow in both of the first and second current paths.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. An energy storage system (ESS) configured to be permanently connected to a power grid, the ESS comprising:
   a battery system controller (BSC) configured to determine whether to use the ESS based on a battery current, voltage, and temperature;
   a plurality of battery racks connected in series or in parallel with each other;
   a positive output terminal configured to output a power supplied from the plurality of battery racks outside;
   a negative output terminal; and
   an ESS power cut-off unit configured to block the use of the ESS by receiving a command from the BSC;
   wherein the ESS power cut-off unit comprises:
   a contactor having a first end connected to each battery rack of the ESS and a second end connected to the positive output terminal of the ESS, the contactor being configured to form an electrical path between each battery rack and the positive output terminal of the ESS; and
   a current measuring unit positioned on an electrical path between each battery rack and the contactor, the current measuring unit being configured to measure a current of the electrical path and transmit the measured current to the BSC,
   wherein the contactor comprises:
   a first relay having a first end connected to an output of the current measuring unit and a second end directly connected to the positive output terminal of the ESS to form a first current path;
   a second relay having a first end connected to the output of the current measuring sensor and a second end directly connected to the positive output terminal of the ESS to form a second current path;
   a first detection unit configured to detect whether the first relay is welded and transmit a detection result to the BSC; and
   a second detection unit configured to detect whether the second relay is welded and transmit a detection result to the BSC;
   wherein the negative output terminal of the ESS is connected to a negative terminal of the plurality of battery racks,
   wherein the first detection unit includes a first photo coupler, and
   wherein the second detection unit includes a second photo coupler.

2. The ESS of claim 1, wherein the first relay and the second relay are connected in parallel.

3. The ESS of claim 2, wherein the first detection unit is a current meter having a first end connected to the output terminal of the current measuring unit and a second end connected to the positive output terminal of the ESS to form a parallel circuit with the first relay, and
   wherein the second detection unit is a current meter having a first end connected to the output terminal of the current measuring unit and a second end connected to the positive output terminal of the ESS to form a parallel circuit with the second relay.

4. The ESS of claim 3,
   wherein the first photo coupler is connected in parallel with the first relay and when the first relay is open, current flows to the first photo coupler to emit light, and
   wherein the second photo coupler is connected in parallel with the second relay and when the second relay is open, current flows to the second photo coupler to emit light.

5. The ESS of claim 4, wherein the first photo coupler comprises a first light emitting part and a first light receiving part insulated from the first light emitting part,
   wherein the first light emitting part is configured to emit light when there is no welding in the first relay and not emit light when there is a welding in the first relay, and
   wherein the first light receiving part is configured to transmit an electrical signal to the BSC when an optical signal is inputted from the first light emitting part.

6. The ESS of claim 4,
   wherein the second photo coupler is connected in parallel with the second relay and when the second relay is open, current flows to the second photo coupler to emit light,
   wherein the second photo coupler comprises a second light emitting part and a second light receiving part insulated from the second light emitting part,
   wherein the second light emitting part is configured to emit light when there is no welding in the second relay and not emit light when there is a welding in the second relay, and
   wherein the second light receiving part is configured to transmit an electrical signal to the BSC when an optical signal is inputted from the second light emitting part.

7. A method for detecting whether a contactor of an energy storage system (ESS) is welded, the method comprising:
   providing the ESS, the ESS being permanently connected to a power grid;
   a current measuring step of measuring an output current of the ESS by a current measuring unit;
   a current checking step of checking whether the measured output current of the ESS is less than an allowable current of a first relay and a second relay constituting the contactor of the ESS;
   a first relay welding checking step of opening the first relay while maintaining the second relay in a closed state and checking whether the first relay is welded using a first detection unit when the output current of the ESS is less than the allowable current of the first relay and the second relay; and a second relay welding checking step of checking whether the second relay is welded using a second detection unit while maintaining the first relay in a closed state and opening the second relay, wherein the first relay has a first end connected to an output of the current measuring unit and a second end directly connected to a positive output terminal of the ESS to form a first current path, wherein the second relay has a first end connected to the output of the current measuring unit and a second end directly connected to the positive output terminal of the ESS to form a second current path, wherein a negative output terminal of the ESS is connected to a negative terminal of a plurality of battery racks, wherein in the first relay welding checking step, when the first relay is opened and the first current path is cut off and the current flows only through the second current path, the first detection unit is used to check whether the first relay is welded, wherein in the second relay welding checking step, the first relay is closed and the second relay is open to cut off the second current path, and whether the second relay is welded is checked using a second detection unit while current flows only in the first current path, wherein the first detection unit includes a first photo coupler, and wherein the second detection unit includes a second photo coupler.

8. The method of claim 7, wherein the second relay welding checking step is performed only when the welding of the first relay is not detected.

9. The method of claim 7, wherein when the welding of the first relay is detected in the first relay welding checking step, a first relay welding detection signal is transmitted to a battery system controller (BSC), and the second relay welding checking step is not performed.

* * * * *